(12) United States Patent
Shin

(10) Patent No.: US 6,979,618 B2
(45) Date of Patent: Dec. 27, 2005

(54) METHOD OF MANUFACTURING NAND FLASH DEVICE

(75) Inventor: Young Ki Shin, Kyungki-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 0 days.

(21) Appl. No.: 10/887,964

(22) Filed: Jul. 9, 2004

(65) Prior Publication Data

US 2005/0106814 A1 May 19, 2005

(30) Foreign Application Priority Data

Nov. 13, 2003 (KR) .................. 10-2003-0080047

(51) Int. Cl.[7] .................. H01L 21/336; H01L 21/265
(52) U.S. Cl. .................. 438/257; 438/259; 438/263; 438/522
(58) Field of Search .................. 438/257, 259, 438/263, 522, 201, 542

(56) References Cited

U.S. PATENT DOCUMENTS 5,751,631 A * 5/1998 Liu et al. .............. 365/185.01
5,907,171 A * 5/1999 Santin et al. ............ 257/315
6,660,604 B1 * 12/2003 Hwang et al. ........... 438/305

* cited by examiner

Primary Examiner—William M. Brewster
(74) Attorney, Agent, or Firm—Marshall, Gerstein & Borun LLP

(57) ABSTRACT

A method of manufacturing a NAND flash device which can improve uniformity of disturb fail characteristics by performing an annealing process after an ion implantation process for forming a P well, reduce a fail bit count by performing an annealing process after an ion implantation process for controlling a threshold voltage and before a process for forming a high voltage gate oxide film, and prevent disturb fail by omitting an STI ion implantation process in a cell region.

6 Claims, 4 Drawing Sheets

METHOD OF MANUFACTURING NAND FLASH DEVICE

BACKGROUND

1. Technical Field

A method of manufacturing a NAND flash device, is disclosed which can prevent program disturb defects from being generated due to damages of ion implantation processes for controlling wells and a threshold voltage.

2. Discussion of Related Art

An ion implantation process for forming a triple well, an ion implantation process for forming a P well, an ion implantation process for forming an N well, an ion implantation process for controlling a threshold voltage, a process for forming a gate oxide film for a high voltage device in a high voltage device region, a process for forming a tunnel oxide film in a cell region, and a process for forming an element isolation film are sequentially performed before a process for forming a gate of 0.115 μm tech of NAND flash EEPROM. Gate electrodes, namely a floating gate electrode and a control gate electrode are formed on the resulting structure.

However, an annealing process is not at all performed after the ion implantation processes for controlling the wells and the threshold voltage, so that damages of a semiconductor substrate by the ion implantation cannot be cured. Such damages cause dislocation of the semiconductor substrate and generate leakage current paths on the semiconductor substrate, which results in program disturb fail.

SUMMARY OF THE DISCLOSURE

A method of manufacturing a NAND flash device is disclosed which can prevent program disturb fail by performing a P well annealing process after an ion implantation process for forming a P well, and performing an annealing process before a process for forming a gate oxide film for a high voltage device.

One disclosed method comprises performing a first ion implantation process for forming a triple well and a second ion implantation process for forming a P well on a semiconductor substrate; performing a first annealing process for curing damages of the semiconductor substrate by the first and second ion implantation processes; performing a third ion implantation process for forming an N well and a fourth ion implantation process for controlling a threshold voltage; forming a high voltage gate oxide film in a high voltage device region, and forming a tunnel oxide film in a low voltage device region and a cell region; and sequentially forming an element isolation film and a gate electrode.

Preferably, the method further includes performing a second annealing process for curing damages of the semiconductor substrate by the third and fourth ion implantation processes after the fourth ion implantation process and before the process for forming the high voltage gate oxide film.

Preferably, the first and second annealing processes are performed at a temperature ranging from 700 to 1100° C. under $N_2$ gas atmosphere.

Another method comprises forming a triple well, a P well, an N well and an ion layer for controlling a threshold voltage on a semiconductor substrate by performing predetermined ion implantation processes; performing an annealing process for curing damages of the semiconductor substrate by the ion implantation processes; forming a high voltage gate oxide film in a high voltage device region, and forming a tunnel oxide film in a low voltage device region and a cell region; and sequentially forming an element isolation film and a gate electrode.

Preferably, the annealing process is performed at a temperature ranging from 700 to 1100° C. under $N_2$ gas atmosphere.

DETAILED DESCRIPTION OF PREFERRED EMBODIMENTS

Figure 1:
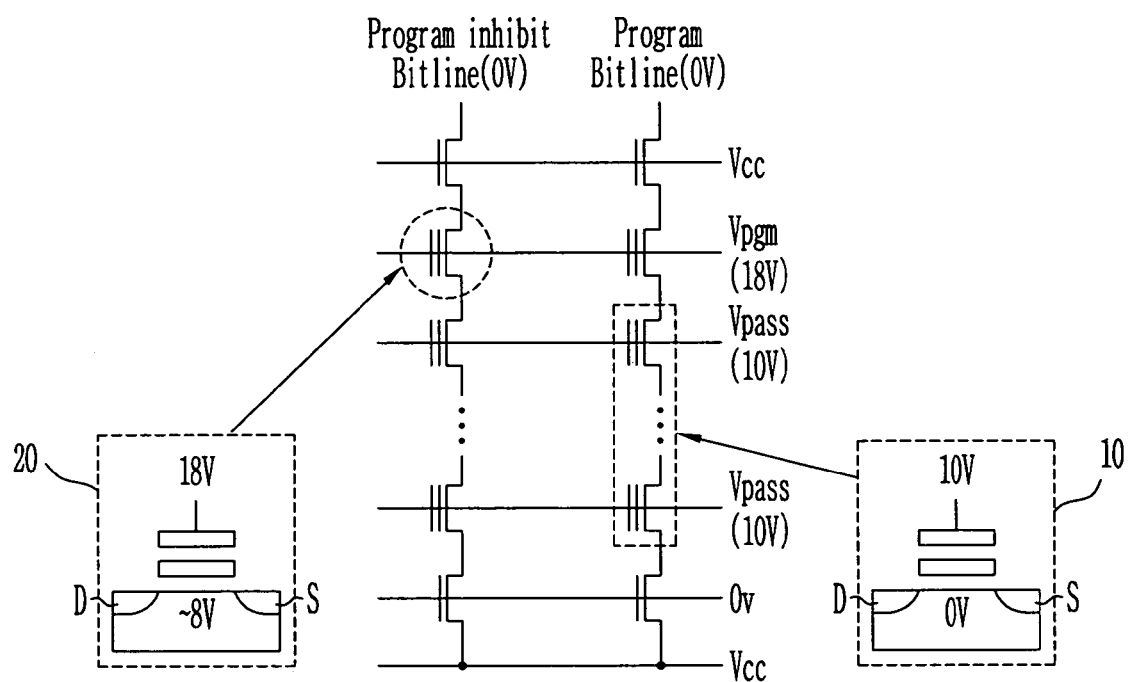
FIG. 1 is a concept diagram showing disturb defects of a flash device.

Disclosed methods of manufacturing a NAND flash device will now be described in detail with reference to the accompanying drawings. Wherever possible, the same reference numerals will be used throughout the drawings and the description to refer to the same or like parts.

FIG. 1 is a concept diagram showing disturb defects of a flash device.

Referring to FIG. 1, the disturb in a NAND flash EEPROM is divided into two modes, bypass disturb Vpass 10 and program disturb Vpgm 20. The bypass disturb fail occurs when an intrinsic program speed (F-N tunneling) is abnormally high for normal cells. That is, the bypass disturb fail is generated in cells receiving a bypass voltage. The program disturb fail occurs when channel boosting is not normally performed due to a leakage current generated between an inversion layer and a lower semiconductor substrate by dislocation of the substrate. That is, the program disturb fail is generated in cells (program cells) receiving a program voltage. An annealing process can prevent disturb defects of the flash device.

Figure 2A:
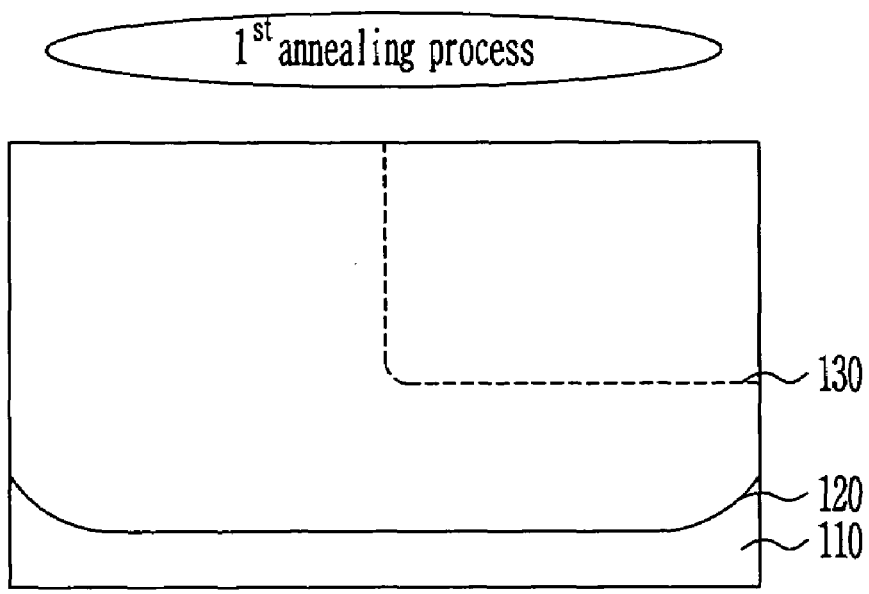
FIGS. 2A and 2B are cross-sectional diagrams illustrating sequential steps of a disclosed method of manufacturing a NAND flash device.
Figure 2B:
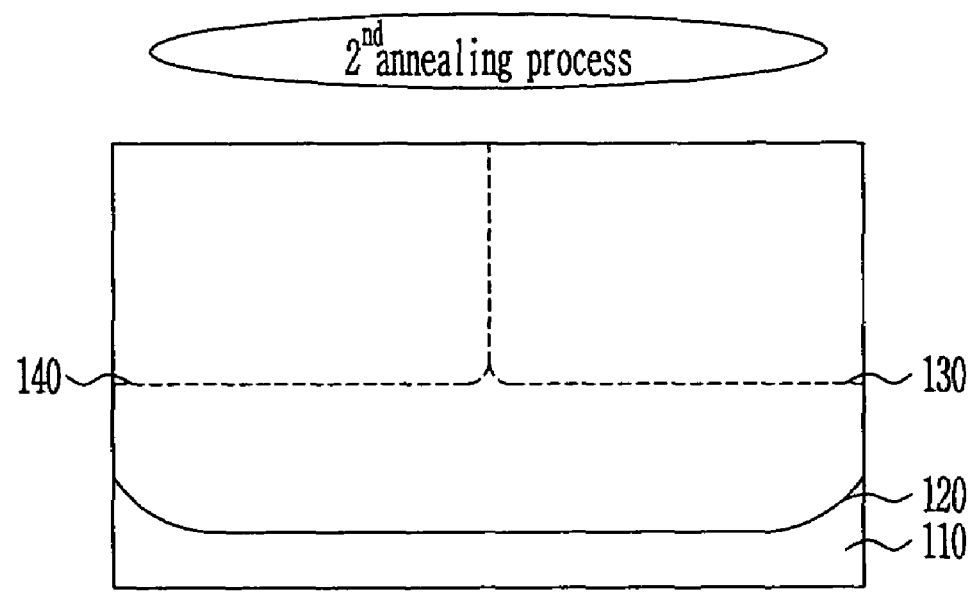

FIGS. 2A and 2B are cross-sectional diagrams illustrating sequential steps of a disclosed method of manufacturing the NAND flash device.

As illustrated in FIG. 2A, an ion implantation process for forming a triple well is performed on a semiconductor substrate 110, to form a triple well 120. An ion implantation process for forming a P well is performed in a PMOS device formation region, to form a P well 130. A first annealing process is performed to compensate for damages of the semiconductor substrate 110 by the ion implantation processes, activate ions and improve distribution uniformity.

Preferably, the first annealing process is performed at a temperature ranging from 700 to 1100° C. under $N_2$ gas atmosphere for about 20 to 40 min. A high temperature thermal oxidation process for forming a screen oxide film used as a buffer film in a succeeding ion implantation process can be performed with the first annealing process.

As shown in FIG. 2B, an ion implantation process for forming an N well is performed to form an N well 140. An ion implantation process for controlling a threshold voltage is performed to form an ion layer (not shown) for controlling a threshold voltage. A second annealing process is performed to compensate for damages of the semiconductor substrate 10 by the ion implantation processes, thereby remarkably reducing a fail bit count.

Preferably, the second annealing process is performed at a temperature ranging from 700 to 1100° C. under $N_2$ gas atmosphere for about 1 to 100 min. The second annealing process is selected from an annealing process using a furnace and a rapid thermal process (RTP).

In order to form the wells and the ion layer for controlling the threshold voltage, ion implantation processes can be performed merely in target regions on the semiconductor substrate 110 according to a patterning process using a photoresist film. In addition, doses and Rp of the ion implantation processes can be varied under the conditions of the devices formed in the upper sides.

A gate oxide film (not shown) for a high voltage device is formed over the resulting structure where the wells and the ion layer for controlling the threshold voltage have been formed, and removed in low voltage device and cell formation regions. A tunnel oxide film (not shown) is formed on the resulting structure. An element isolation film (not shown) is formed according to a self aligned shallow trench isolation (SA-STI) process. A polysilicon film (not shown) for a floating gate and a pad insulation film (not shown) are formed on the tunnel oxide film. An element isolation trench (not shown) is formed by etching the pad insulation film, the polysilicon film, the tunnel oxide film (gate oxide film) and the semiconductor substrate 110. An element isolation film is formed by filling the element isolation trench with an oxide film, and performing a planarization process using the pad insulation film as a barrier film. Generally, in order to remove sub threshold hump characteristics of a low voltage NMOS transistor, an STI ion implantation process is performed to compensate for boron segregation on the STI sidewalls after the process for etching the trench. However, the disclosed STI ion implantation process is not performed in the cell region, thereby reducing the fail bit count by three to four times. For the disclosed process, a photoresist film pattern is formed on the cell region, the STI ion implantation process is performed thereon, the photoresist film is removed and the oxide film is filled and planarized, after the process for forming the element isolation trench.

Figure 3A:
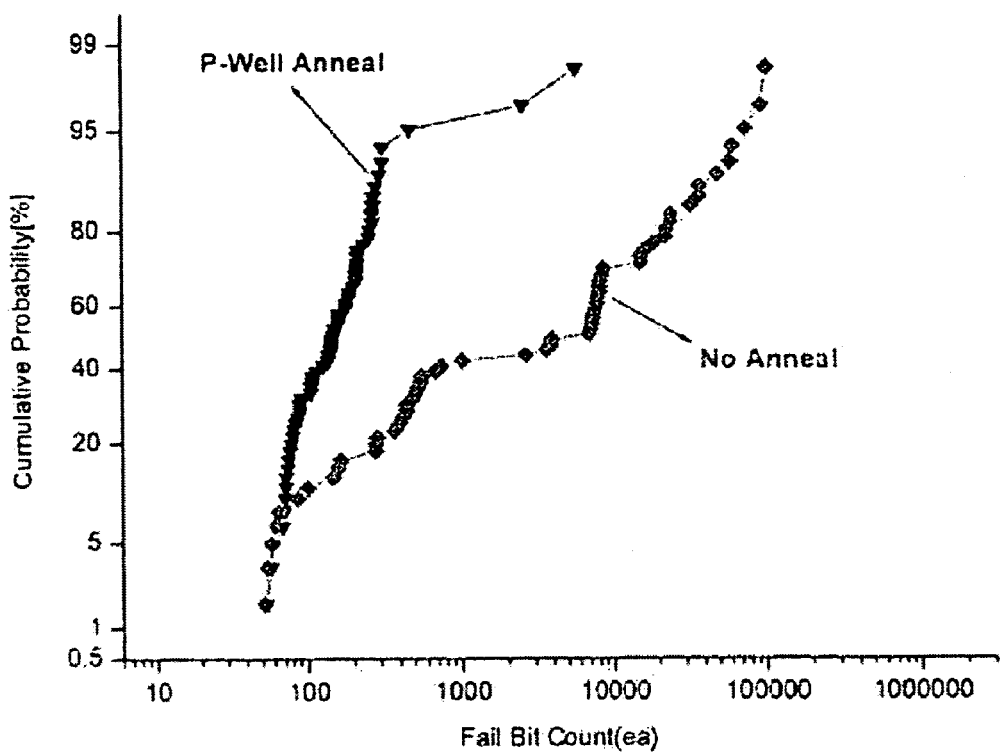
FIG. 3A is a graph showing a bypass disturb fail bit count by an annealing process after a process for forming a P well.
Figure 3B:
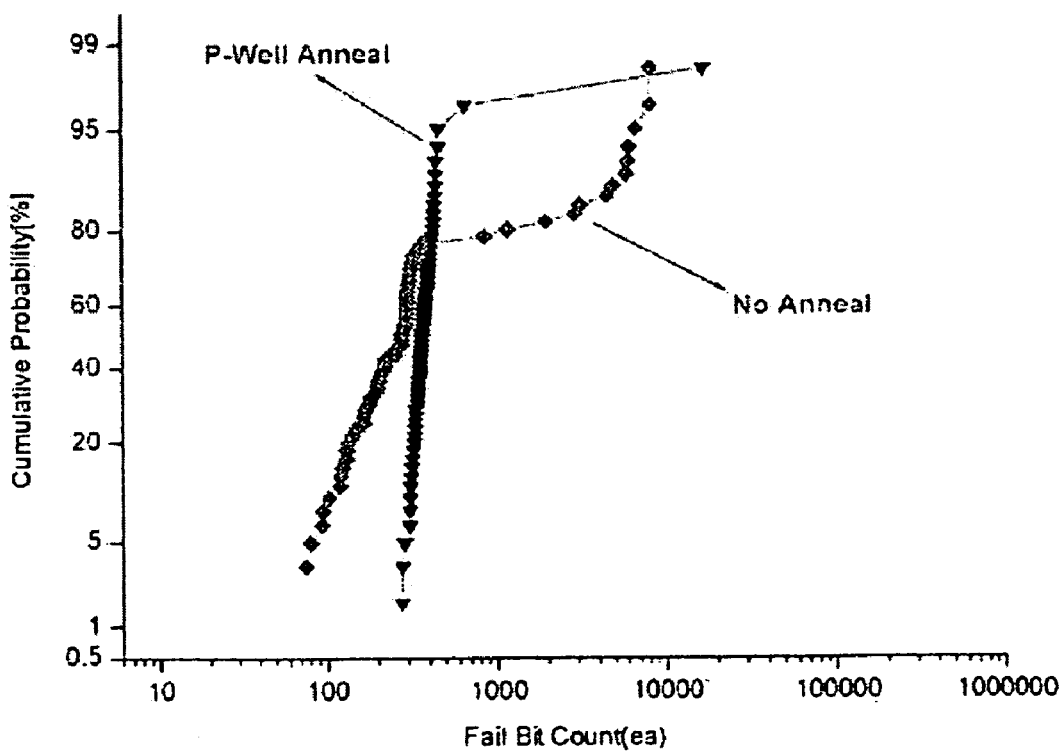
FIG. 3B is a graph showing a program disturb fail bit count.

FIG. 3A is a graph showing a bypass disturb fail bit count by the annealing process after the process for forming the P well, and FIG. 3B is a graph showing a program disturb fail bit count.

As depicted in FIGS. 3A and 3B, when the disturb of the flash device is measured after forming the P well and performing the annealing process thereon at about 950° C. for about 30 min., the uniformity of the bypass disturb and program disturb characteristics is improved. That is, damages of the semiconductor substrate by the high energy well ion implantation process are cured by the annealing process. As shown in FIG. 3A, on the basis of cumulative probability distribution, the fail bit count is distributed from 100 to 100000 ea without the annealing process, but aligned in about 100 ea after the annealing process. As illustrated in FIG. 3B, the fail bit count is distributed from 100 to 10000 ea without the annealing process, but aligned in about 200 ea after the annealing process.

Figure 4:
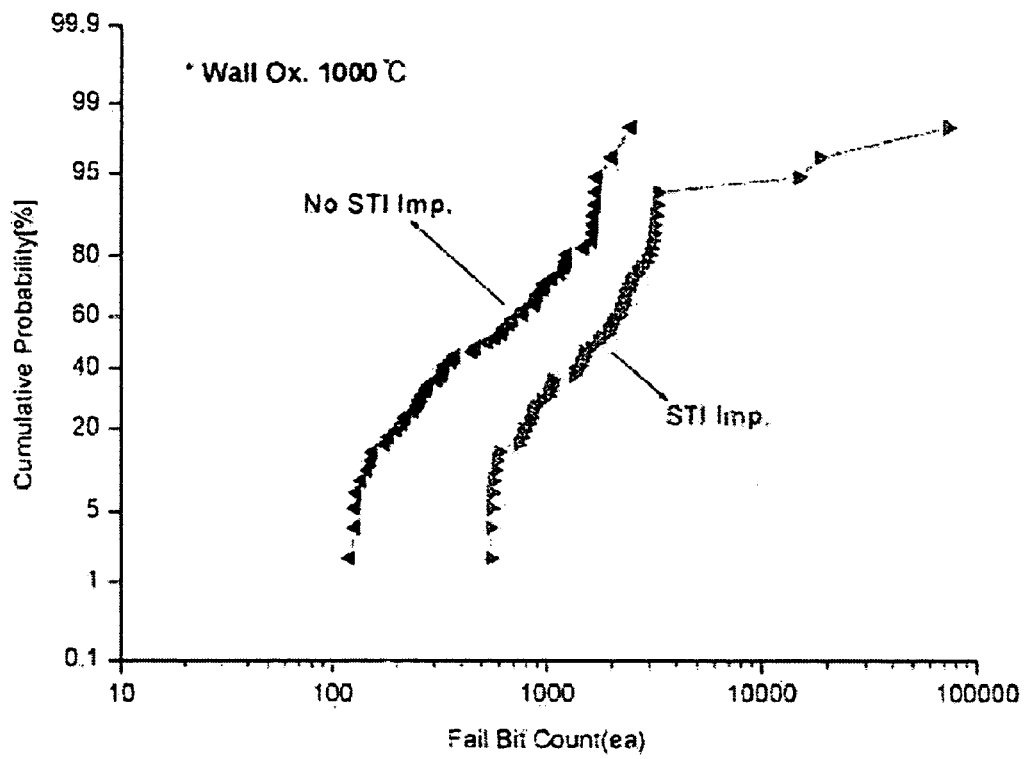
FIG. 4 is a graph showing a bypass disturb fail bit count by an STI ion implantation process.

FIG. 4 is a graph showing a bypass disturb fail bit count by the STI ion implantation process.

Referring to FIG. 4, the STI ion implantation process is performed on the sidewalls of the trench to compensate for boron variations inside the semiconductor substrate due to the etching process for forming the trench during the STI process for forming the element isolation film, which increases the bypass disturb fail bit count of the cell. That is, when the cumulative probability is 40%, the fail bit count is about 1000 ea after the ion implantation process, but about 300 ea without the ion implantation process. In the case that the STI ion implantation process is applied to the cell region, the bypass fail bit count is increased by three to four times. Accordingly, when the STI ion implantation process is not performed in the cell region, the fail bit count can be considerably reduced.

Figure 5:
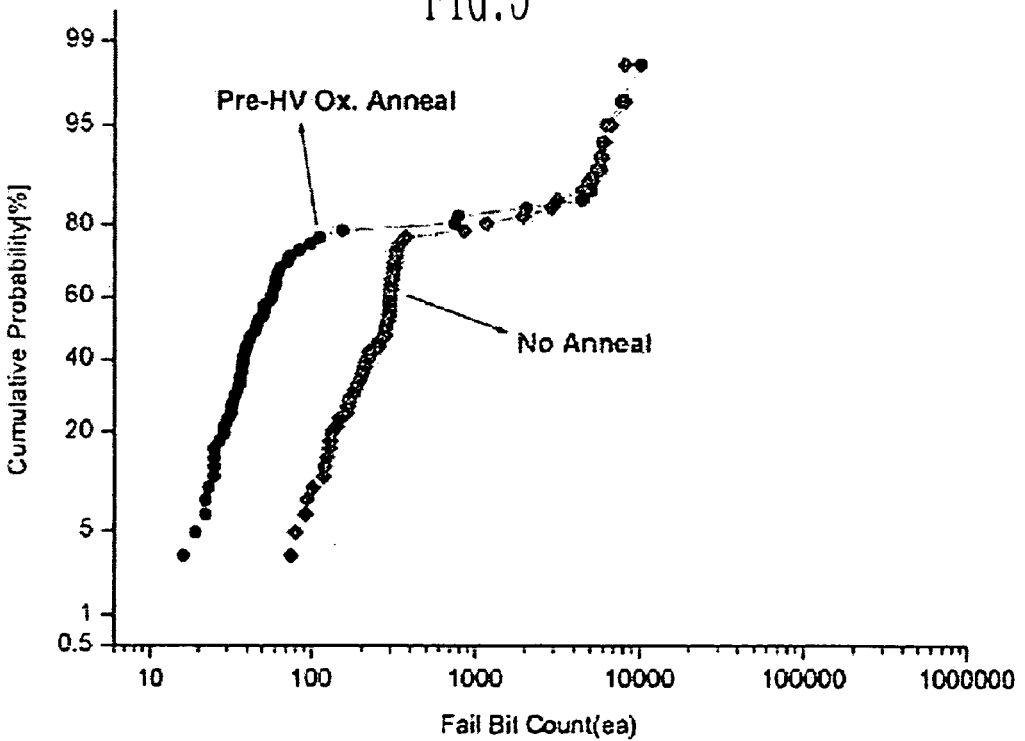
FIG. 5 is a graph showing a program disturb fail bit count by an annealing process before a process for forming a high voltage gate oxide film.

FIG. 5 is a graph showing a program disturb fail bit count by the annealing process before the process for forming the high voltage gate oxide film.

As shown in FIG. 5, the program disturb characteristics are remarkably improved by performing the annealing process before the process for forming the high voltage gate oxide film, namely after the process for forming the N well and the ion layer for controlling the threshold voltage. When the cumulative probability is 50%, the fail bit count is varied by six to seven times according to the annealing process. That is, the thermal annealing process can cure defects of the semiconductor substrate after the ion implantation process for controlling the threshold voltage.

As a result, uniformity of the disturb fail characteristics can be improved by additionally performing the annealing process after the process for forming the P well, and the fail bit count can be reduced by performing the annealing process after the ion implantation process for controlling the threshold voltage and before the process for forming the high voltage gate oxide film. It implies that the annealing process can cure the defects of the semiconductor substrate resulting from the ion implantation damages. Moreover, the STI ion implantation process is not applied to the cell region, to prevent the disturb fail.

As described above, in accordance with the disclosed techniques, uniformity of the disturb fail characteristics of the flash device can be improved by performing the annealing process after the ion implantation process for forming the P well.

In addition, the fail bit count can be reduced by performing the annealing process after the ion implantation process for controlling the threshold voltage and before the process for forming the high voltage gate oxide film.

Furthermore, the STI ion implantation process is not performed in the cell region, thereby preventing the disturb fail.

Although the disclosed methods have been described in connection with the accompanying drawings, they are not limited thereto. It will be apparent to those skilled in the art that various substitutions, modifications and changes may be made thereto without departing from the scope and spirit of the disclosed methods and appended claims.

What is claimed is:

1. A method of manufacturing a NAND flash device, comprising the steps of:

performing a first ion implantation process for forming a triple well in a semiconductor substrate and a second ion implantation process for forming a P well in a first region of the triple well;

performing a first annealing process for curing damages of the semiconductor substrate by the first and second ion implantation processes; and performing a third ion implantation process for forming an N well in a second region of the triple well and a fourth ion implantation process for controlling a threshold voltage.

2. The method of claim 1, further comprising performing a second annealing process for curing damages of the semiconductor substrate by the third and fourth ion implantation processes after the fourth ion implantation process and before a deposition of another film.

3. The method of claim 1, wherein the first annealing process is performed at a temperature ranging from 700 to 1100° C. and under $N_2$ gas atmosphere.

4. The method of claim 2, wherein the second annealing process is performed at a temperature ranging from 700 to 1100° C. and under $N_2$ gas atmosphere.

5. A method of manufacturing a NAND flash device, comprising the steps of:

forming a triple well, a P well, an N well and an ion layer for controlling a threshold voltage on a semiconductor substrate by performing predetermined ion implantation processes; and performing an annealing process for curing damages of the semiconductor substrate by the ion implantation processes before forming a gate oxide film, wherein, the P well is formed in a first region of the triple well, and the N well is formed in a second region of the triple well.

6. The method of claim 5, wherein the annealing process is performed at a temperature ranging from 700 to 1100° C. under $N_2$ gas atmosphere.

* * * * *